United States Patent
Wen

(10) Patent No.: US 10,505,002 B2
(45) Date of Patent: Dec. 10, 2019

(54) THIN FILM TRANSISTOR AND MANUFACTURING METHOD THEREOF, DISPLAY SUBSTRATE AND DISPLAY PANEL

(71) Applicant: BOE TECHNOLOGY GROUP CO., LTD., Beijing (CN)

(72) Inventor: Yu Wen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/841,169

(22) Filed: Dec. 13, 2017

(65) Prior Publication Data
US 2018/0342591 A1    Nov. 29, 2018

(30) Foreign Application Priority Data

May 23, 2017 (CN) .......................... 2017 1 0370472

(51) Int. Cl.
| | |
|---|---|
| *H01L 27/12* | (2006.01) |
| *H01L 29/786* | (2006.01) |
| *H01L 29/417* | (2006.01) |
| *H01L 29/66* | (2006.01) |
| H01L 27/32 | (2006.01) |

(52) U.S. Cl.
CPC .... *H01L 29/41733* (2013.01); *H01L 27/1222* (2013.01); *H01L 29/66765* (2013.01); *H01L 29/78669* (2013.01); *H01L 27/3262* (2013.01)

(58) Field of Classification Search
CPC ........... H01L 29/41733; H01L 27/1222; H01L 29/66765; H01L 29/78669; H01L 27/3262
USPC ........ 257/59, 72, 401; 438/48, 128.284, 286
See application file for complete search history.

(56) References Cited

U.S. PATENT DOCUMENTS

| | | | | |
|---|---|---|---|---|
| 2004/0036072 | A1* | 2/2004 | Tsujimura et al. | ..... H01L 27/12 257/72 |
| 2004/0245523 | A1* | 12/2004 | Jen et al. | .......... H01L 29/41733 257/59 |
| 2006/0131669 | A1* | 6/2006 | Albagli et al. | .......... H01L 27/12 257/401 |
| 2013/0207101 | A1* | 8/2013 | Yamazaki et al. | .......................... H01L 29/7869 257/43 |
| 2015/0214254 | A1* | 6/2015 | Yan et al. | ........... H01L 27/1248 257/72 |

FOREIGN PATENT DOCUMENTS

CN            104835851 A        8/2015

OTHER PUBLICATIONS

The First Office Action issued in Chinese Patent Application No. 201710370472.X, dated May 23, 2019; with English translation.

* cited by examiner

*Primary Examiner* — Thinh T Nguyen
(74) *Attorney, Agent, or Firm* — McDermott Will & Emery LLP

(57) ABSTRACT

A thin film transistor includes a gate pattern, a gate insulating layer, an active layer and a source-drain pattern, which are all arranged on a substrate. The source-drain pattern includes a source electrode and a drain electrode. An orthographic projection of the drain electrode on the substrate is shaped like a ring, and an orthographic projection of the source electrode on the substrate is elliptic or circular. The drain electrode is arranged around the source electrode.

14 Claims, 9 Drawing Sheets

THIN FILM TRANSISTOR AND MANUFACTURING METHOD THEREOF, DISPLAY SUBSTRATE AND DISPLAY PANEL

CROSS-REFERENCE TO RELATED APPLICATION

This application claims priority to Chinese Patent Application No. 201710370472.X, filed on May 23, 2017, titled "THIN FILM TRANSISTOR AND MANUFACTURING METHOD THEREOF, DISPLAY SUBSTRATE AND DISPLAY PANEL", which is incorporated herein by reference in its entirety.

TECHNICAL FIELD

The present disclosure relates to the technical field of display, and in particular to a thin film transistor and a manufacturing method thereof, a display substrate and a display panel.

BACKGROUND

In general, thin film transistors (TFTs) are provided in a display device, and the stability of output drain currents of the TFTs will directly influence the display effect of the display device. A TFT includes a gate pattern, a gate insulating layer, a source-drain pattern, an insulating layer and other hierarchical structures. The gate pattern includes a gate electrode, and the source-drain pattern includes a source electrode and a drain electrode.

SUMMARY

In a first aspect, an embodiment of the present disclosure provides a thin film transistor. The thin film transistor includes a gate pattern, a gate insulating layer, an active layer and a source-drain pattern, which are all arranged on a substrate. The source-drain pattern comprises a source electrode and a drain electrode. An orthographic projection of the drain electrode on the substrate is shaped like a ring. An orthographic projection of the source electrode on the substrate is elliptic or circular. The drain electrode is arranged around the source electrode.

In an embodiment, the orthographic projection of the drain electrode on the substrate is shaped like a circular ring, and the orthographic projection of the source electrode on the substrate is circular.

In an embodiment, the source electrode and the drain electrode are concentric.

In an embodiment, a cross-section of the source electrode perpendicular to the surface of the substrate is saw-toothed or waved.

In an embodiment, a cross-section of the drain electrode perpendicular to the surface of the substrate is saw-toothed or waved.

In an embodiment, the cross-section of the source electrode perpendicular to the surface of the substrate is saw-toothed, depths of teeth of a saw-toothed shape are equal to a thickness of the source electrode in a preset direction, and the preset direction is perpendicular to the surface of the substrate.

In an embodiment, the cross-section of the drain electrode perpendicular to the surface of the substrate is saw-toothed, depths of teeth of the saw-toothed shape are equal to a thickness of the drain electrode in a preset direction, and the preset direction is perpendicular to the surface of the substrate.

In an embodiment, orthographic projection of the gate pattern, the gate insulating layer and/or the active layer on the substrate is elliptic or circular.

In a second aspect, an embodiment of the present disclosure provides a method for manufacturing a thin film transistor. The method includes the step of forming a gate pattern, a gate insulating layer, an active layer and a source-drain pattern on a substrate, the source-drain pattern comprising a source electrode and a drain electrode, an orthographic projection of the drain electrode on the substrate being shaped like a ring, an orthographic projection of the source electrode on the surface of the substrate being elliptic or circular, and the drain electrode being arranged around the source electrode.

In an embodiment, the method further includes a step of designing a cross-section of the drain electrode perpendicular to the surface of the substrate to be saw-toothed or waved by a patterning process.

In an embodiment, the method further includes a step of designing a cross-section of the drain electrode perpendicular to the surface of the substrate to be saw-toothed or waved by a patterning process.

In a third aspect, an embodiment of the present disclosure provides a display substrate. The display substrate includes the thin film transistor in the embodiments of the first aspect.

In an embodiment, the display substrate further includes a drain lead connected to the drain electrode, a passivation layer provided on the source-drain pattern, a via formed on the passivation layer, and a source lead provided on the passivation layer. The source lead is connected to the source electrode through the via.

In a fourth aspect, an embodiment of the present disclosure provides a display panel. The display panel includes the display substrate in the embodiments of the third aspect.

In an embodiment, the display panel is a current-driven display panel.

BRIEF DESCRIPTION OF THE DRAWINGS

To describe the technical solutions in the embodiments of the present disclosure more clearly, the accompanying drawings to be used in the description of the embodiments will be briefly described below. Apparently, the accompanying drawings described hereinafter are some of the embodiments of the present disclosure, and a person of ordinary skill in the art can acquire other accompanying drawings according to these drawings without any creative effort.

DETAILED DESCRIPTION

To make the objectives, technical solutions and advantages of the present disclosure clearer, the implementations of the present disclosure will be further described below in detail with reference to the accompanying drawings.

In general, a source electrode and a drain electrode are arranged at two ends on a side of an active layer away from a substrate. When a drain voltage meets a certain condition, a conducting channel will be formed in the active layer to realize conduction between the drain electrode and the source electrode. A drain current generated after the drain electrode and the source electrode are conducted is a drive current for a display device. The current linearly changes with a width-to-length ratio of the channel.

When the drain voltage increases to a certain extent, a pinch-off region may occur in the channel, that is, the length of the channel may change. Since the drain current linearly changes with the width-to-length ratio of the channel, the change in the length of the channel may result in a high fluctuation of the drain current and thus may influence a display effect of the display device.

Figure 1:
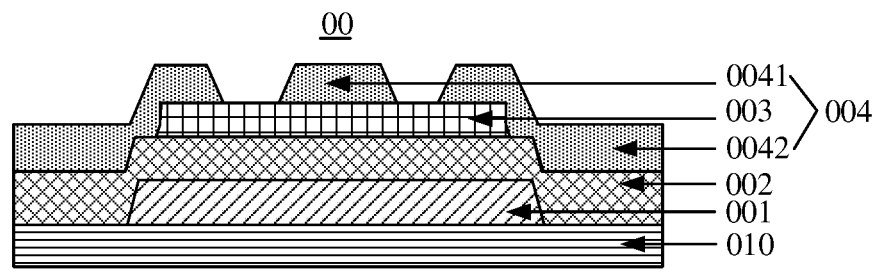
FIG. 1 is a sectional view of a thin film transistor according to an embodiment of the present disclosure.

In order to solve the problem that the occurrence of the pinch-off region in the channel may result in the high fluctuation of drain current and thus may influence the display effect of the display device, an embodiment of the present disclosure provides a thin film transistor. As shown in FIG. 1, the thin film transistor 00 may include a gate pattern 001, a gate insulating layer 002, an active layer 003 and a source-drain pattern 004, which are all arranged on a substrate 010. The source-drain pattern 004 includes a source electrode 0041 and a drain electrode 0042. An orthographic projection of the drain electrode 0042 on the substrate 010 is shaped like a ring, and an orthographic projection of the source electrode 0041 on the substrate 010 is elliptic or circular. The drain electrode 0042 surrounds the source electrode 0041.

It is to be noted that, when a gate voltage reaches a turn-on voltage of a channel, a conducting channel will be formed in the active layer 0003 to realize conduction between the drain electrode 0042 and the source electrode 0041, and a drain current generated after the both are conducted is a drive current for a display device.

In conclusion, in the thin film transistor 00 provided by this embodiment of the present disclosure, the orthographic projection of the drain electrode 0042 on the substrate is designed as a ring shape and the orthographic projection of the source electrode 0041 on the substrate is designed to be elliptic or circular. In addition, the drain electrode 0042 surrounds the source electrode 0041. Therefore, the length-to-width ratio of the channel of the thin film transistor 00 becomes a log function of the size of the channel. The length-to-width ratio of the channel changes slowly when an effective length of the channel changes. Therefore, amplitude of fluctuation of the drain current may be reduced, and a stability of the drain current may be improved, thereby reducing the influence of the change in drain current on the display effect of the display device.

Figure 2A:
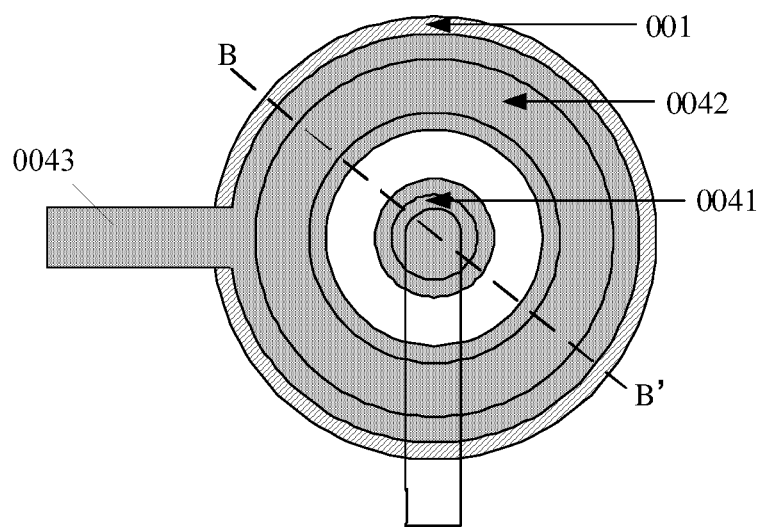
FIG. 2A is a top view of the thin film transistor of FIG. 1.

FIG. 2A is a top view of the thin film transistor 00 of FIG. 1, and FIG. 1 is a sectional view of the thin film transistor 00 of FIG. 2A taken along BB'. As shown in FIGS. 1 and 2A, in an embodiment of the present disclosure, the gate insulating layer 002, the active layer 003 and the source-drain pattern 004 are stacked successively, so that it may be ensured that the gate insulating layer 002 comes into contact with the active layer 003 and the active layer 003 comes into contact with the source-drain pattern 004.

Figure 2B:
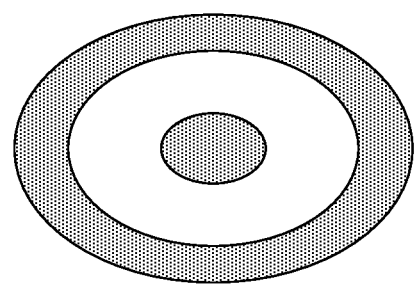
FIG. 2B is a schematic diagram of shapes of orthographic projections of a drain electrode and a source electrode on to a substrate according to an embodiment of the present disclosure, in which the orthographic projection of the drain electrode on the substrate is shaped like an elliptic ring and the orthographic projection of the source electrode on the substrate is elliptic.
Figure 2C:
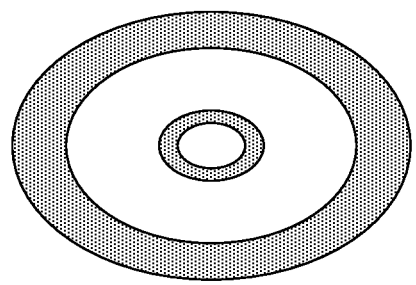
FIG. 2C is a schematic diagram of shapes of orthographic projections of a drain electrode and a source electrode on the substrate according to an embodiment of the present disclosure, in which both the orthographic projections of the drain electrode and the source electrode on the substrate are shaped like elliptic rings.
Figure 2D:
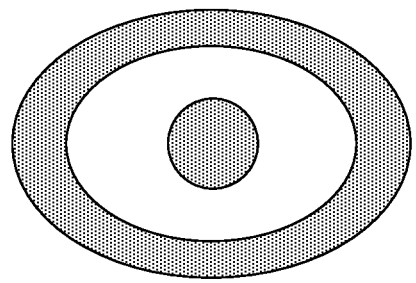
FIG. 2D is a schematic diagram of shapes of orthographic projections of a drain electrode and a source electrode on the substrate according to an embodiment of the present disclosure, in which the orthographic projection of the drain electrode on the substrate is shaped like an elliptic ring and the orthographic projection of the source electrode on the substrate is circular.
Figure 2E:
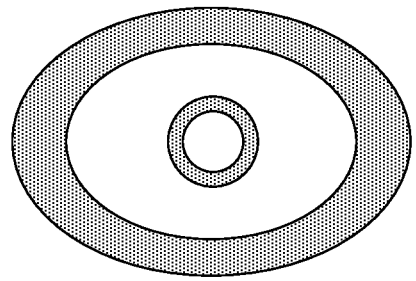
FIG. 2E is a schematic diagram of shapes of orthographic projections of a drain electrode and a source electrode on the substrate according to an embodiment of the present disclosure, in which the orthographic projection of the drain electrode on the substrate is shaped like an elliptic ring and the orthographic projection of the source electrode on the substrate is shaped like a circular ring.
Figure 2F:
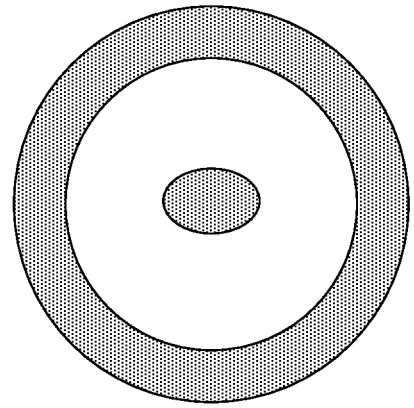
FIG. 2F is a schematic diagram of shapes of orthographic projections of a drain electrode and a source electrode on the substrate according to an embodiment of the present disclosure, in which the orthographic projection of the drain electrode on the substrate is shaped like a circular ring and the orthographic projection of the source electrode on the substrate is elliptic.
Figure 2G:
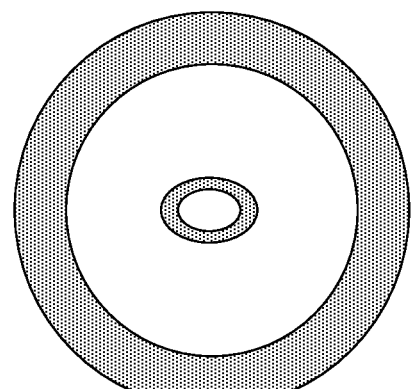
FIG. 2G is a schematic diagram of shapes of orthographic projections of a drain electrode and a source electrode on the substrate according to an embodiment of the present disclosure, in which the orthographic projection of the drain electrode on the substrate is shaped like a circular ring and the orthographic projection of the source electrode on the substrate is shaped like an elliptic ring.
Figure 2H:
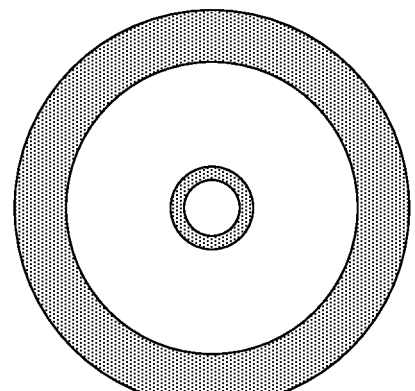
FIG. 2H is a schematic diagram of shapes of orthographic projections of a drain electrode and a source electrode on the substrate according to an embodiment of the present disclosure, in which both the orthographic projections of the drain electrode and the source electrode on the substrate are shaped like circular rings.
Figure 2I:
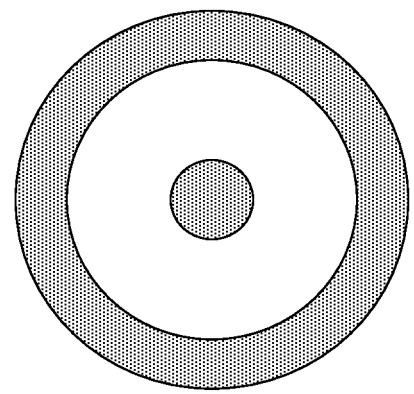
FIG. 2I is a schematic diagram of shapes of orthographic projections of a drain electrode and a source electrode on the substrate according to an embodiment of the present disclosure, in which the orthographic projection of the drain electrode on the substrate is shaped like a circular ring, the orthographic projection of the source electrode on the substrate is circular, and the source electrode and the drain electrode are concentric.

It is to be noted that, the structure of the thin film transistor 00 as shown in FIGS. 1 and 2A is merely illustrative, in which the orthographic projection of the drain electrode 0042 on the substrate 010 is shaped like a circular ring, the orthographic projection of the source electrode 0041 on the substrate 010 is circular, and the source electrode 0041 and the drain electrode 0042 are concentric. In practical applications, the source electrode 0041 and the drain electrode 0042 may be of other structures. For example, the orthographic projection of the drain electrode 0042 on the substrate 010 may be shaped like an elliptic ring or in other shapes, and the orthographic projection of the source electrode 0041 on the substrate 010 may be elliptic, shaped like an elliptic ring or shaped like a circular ring. Exemplarily, as shown in FIG. 2B, the orthographic projection of the drain electrode 0042 on the substrate 010 is shaped like an elliptic ring, and the orthographic projection of the source electrode 0041 on the substrate 010 is elliptic. As shown in FIG. 2C, the orthographic projections of the drain electrode 0042 and the source electrode 0041 on the substrate 010 are shaped like elliptic rings. As shown in FIG. 2D, the orthographic projection of the drain electrode 0042 on the substrate 010 is shaped like an elliptic ring, and the orthographic projection of the source electrode 0041 on the substrate 010 is circular. As shown in FIG. 2E, the orthographic projection of the drain electrode 0042 on the substrate 010 is shaped like an elliptic ring, and the orthographic projection of the source electrode 0041 on the substrate 010 is shaped like a circular ring. As shown in FIG. 2F, the orthographic projection of the drain electrode 0042 on the substrate 010 is shaped like a circular ring, and the orthographic projection of the source electrode 0041 on the substrate 010 is elliptic. As shown in FIG. 2G, the orthographic projection of the drain electrode 0042 on the substrate 010 is shaped like a circular ring, and the orthographic projection of the source electrode 0041 on the substrate 010 is shaped like an elliptic ring. As shown in FIG. 2H, the orthographic projections of the drain electrode 0042 and the source electrode 0041 on the substrate 010 are shaped like circular rings. In addition, the schematic diagram of shapes of the orthographic projections of the source electrode 0041 and the drain electrode 0042 on the substrate 010 shown in FIGS. 1 and 2A refers to FIG. 2I.

Figure 2J:
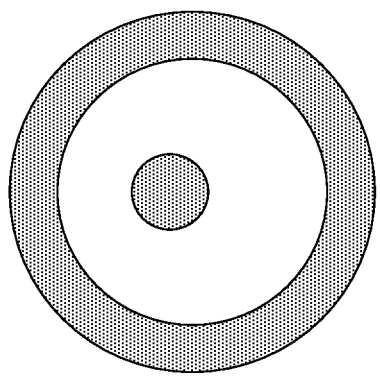
FIG. 2J is a schematic diagram of shapes of orthographic projections of a drain electrode and a source electrode on the substrate according to an embodiment of the present disclosure, in which the orthographic projection of the source electrode on the substrate is circular, the orthographic projection of the drain electrode on the substrate is shaped like a circular ring, and the circular shape and the circular ring shape are not concentric.

It can be seen from the outline diagrams of FIGS. 2B to 2I that, a shape formed by the orthographic projection of the source electrode 0041 on the substrate 010 and the orthographic projection of the drain electrode 0042 on the substrate 010 is center symmetric. For example, it can be seen from the schematic diagram in FIG. 2I that the source electrode 0041 and the drain electrode 0042 are concentric, and the shape formed by the orthographic projections of the both on the substrate 010 is center symmetric. However, in practical applications, the shape formed by the orthographic projections of the source electrode 0041 and the drain electrode 0042 on the substrate 010 may also be non-centrosymmetric. For example, as shown in FIG. 2J, the orthographic projection of the source electrode 0041 on the substrate 010 is circular, and the orthographic projection of the drain electrode 0042 on the substrate 010 is shaped like a circular ring. In addition, the circular shape and the circular ring are not concentric, and thus the shape formed by the orthographic projections of the source electrode 0041 and the drain electrode 0042 on the substrate 010 is non-centrosymmetric. Other situations where the orthographic projection of the drain electrode 0042 on the substrate 010 is shaped like an elliptic ring, shaped like a circular ring or in other ring shapes, the orthographic projection of the source electrode 0041 on the substrate 010 is elliptic, shaped like an elliptic ring, circular, shaped like a circular ring or in other ring shapes and the shape formed by the orthographic projections of the both on the substrate 010 is non-centrosymmetric will not be repeated here.

In an embodiment of the present disclosure, when the orthographic projection of the drain electrode 0042 on the substrate 010 is shaped like a ring and the orthographic projection of the source electrode 0041 on the substrate 010 is elliptic or shaped like a ring, the cross-section of the source electrode 0041 and the drain electrode 0042 perpendicular to the surface of the substrate 010 may be in various shapes.

In an example, the cross-section of the source electrode 0041 perpendicular to the surface of the substrate 010 is saw-toothed or waved, and/or, the cross-section of the drain electrode 0042 perpendicular to the surface of the substrate 010 is saw-toothed or waved. The saw-toothed shape may for example be saw teeth in form of square waves or triangular saw teeth. The depths of teeth of the saw-toothed shape are less than the respective thickness of the source electrode 0041 and the drain electrode 0042 in a preset direction, and the preset direction is perpendicular to the surface of the substrate 010.

In another example, the cross-section of the source electrode 0041 perpendicular to the surface of the substrate 010 is saw-toothed or waved, and/or, the cross-section of the drain electrode 0042 perpendicular to the surface of the substrate 010 is saw-toothed or waved. The saw-toothed shape may for example be saw teeth in form of square waves or triangular saw teeth. The depths of teeth of the saw-toothed shape are equal to the respective thickness of the source electrode 0041 and the drain electrode 0042 in a preset direction, and the preset direction is perpendicular to the surface of the substrate 010.

In the above two situations, the shape of the orthographic projection of the source electrode 0041 on the substrate 010 may be a combined pattern formed by a ring shape and a circular shape or an elliptic shape, or the shape of the orthographic projection of the source electrode 0041 on the substrate 010 may be a combined pattern formed by a plurality of successively surrounded ring shapes.

In an embodiment of the present disclosure, when the source electrode 0041 or the drain electrode 0042 is in any one of the two situations, the shape of the source electrode 0041 and the shape of the drain electrode 0042 may be combined with each other. For example, the cross-section of the source electrode 0041 and the drain electrode 0042 perpendicular to the surface of the substrate 010 are saw-toothed, wherein the depths of teeth of the saw-toothed shape of the source electrode 0041 are less than the thickness of the source electrode 0041 in a present direction, and the depths of teeth of the saw-toothed shape of the drain electrode 0042 are equal to the thickness of the drain electrode 0042 in the preset direction.

Figure 2K:
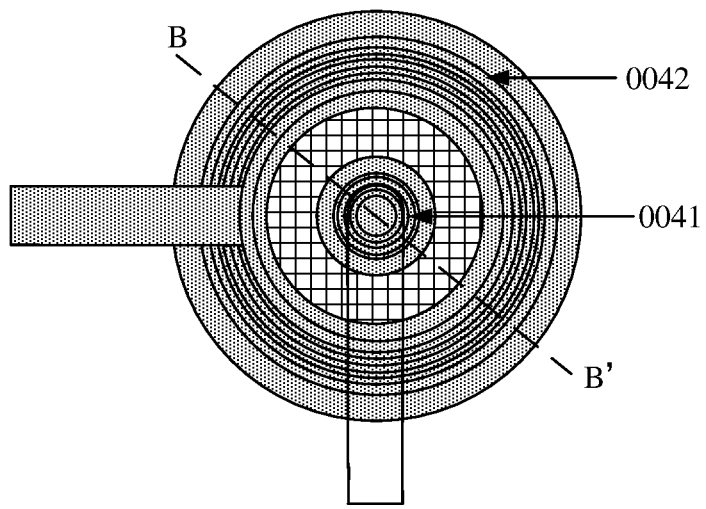
FIG. 2K is a top view of the thin film transistor according to an embodiment of the present disclosure, in a situation that the cross-sections of the source electrode and the drain electrode perpendicular to the surface of the substrate are saw-toothed in form of square waves and depths of teeth of the saw-toothed shape are less than the respective thickness in a preset direction.
Figure 2L:
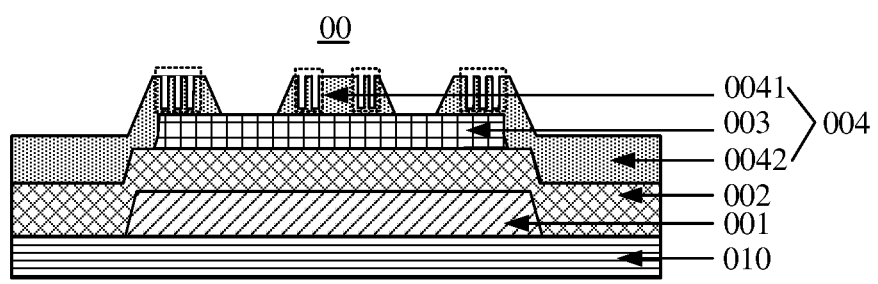
FIG. 2L is a sectional view of the thin film transistor of FIG. 2K taken along BB'.

In an example, as shown in FIG. 2K, the cross-sections of the source electrode 0041 and the drain electrode 0042 perpendicular to the surface of the substrate 010 are saw-toothed in form of square waves, and the depths of teeth of the saw-toothed shapes are less than the respective thickness of the source electrode 0041 and the drain electrode 0042 in the preset direction. The sectional view of the thin film transistor 00 of FIG. 2K taken along BB' refers to FIG. 2L, in which a cross-section of a portion of the source electrode 0041 in a dashed box perpendicular to the surface of the substrate 010 is saw-toothed in form of square waves and a cross-section of a portion of the drain electrode 0042 in another dashed box perpendicular to the surface of the substrate 010 is saw-toothed in form of square waves (in practical applications, since there are other layers are provided on the source electrode 0041 and the drain electrode 0042 in the preset direction, for example, a passivation layer, there may be material of this film later in the square-wave saw teeth of the drain electrode 0041 and the source electrode 0042; for observation convenience, the material of this film layer is not shown in FIG. 2L).

Figure 2M:
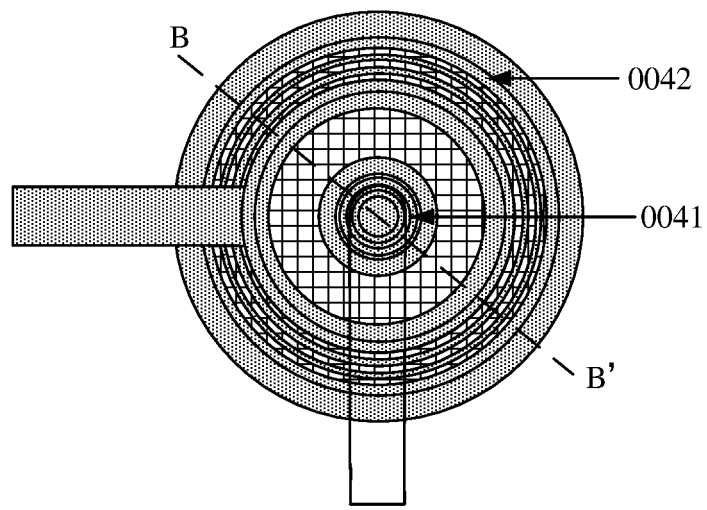
FIG. 2M is a top view of the thin film transistor according to an embodiment of the present disclosure, in a situation that the cross-sections of the source electrode and the drain electrode perpendicular to the surface of the substrate are saw-toothed in form of square waves, depths of teeth of the saw-toothed shape corresponding to the source electrode are less than the thickness of the source electrode in a preset direction, and depths of teeth of the saw-toothed shape corresponding to the drain electrode are equal to the thickness of the drain electrode in a preset direction.
Figure 2N:
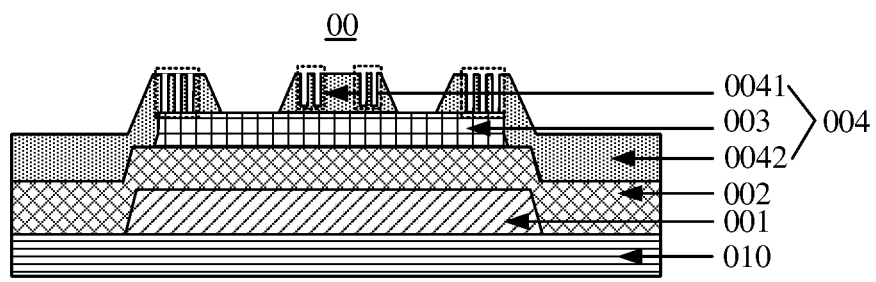
FIG. 2N is a sectional view of the thin film transistor of FIG. 2M taken along BB'.

In another example, as shown in FIG. 2K, the cross-sections of the source electrode 0041 and the drain electrode 0042 perpendicular to the surface of the substrate 010 are both saw-toothed in form of square waves. In addition, the depths of teeth of the saw-toothed shape of the source electrode 0041 are less than the thickness of the source electrode 0041 in the present direction, and the depths of teeth of the saw-toothed shape of the drain electrode 0042 are equal to the thickness of the drain electrode 0042 in the preset direction. A sectional view of the thin film transistor 00 of FIG. 2M taken along BB' refers to FIG. 2N, wherein portions of source electrode 0041 and drain electrode 0042 in dashed boxes are of square-wave saw-toothed structures (FIG. 2N does not show the material of a film layer that may be contained in the square-wave saw teeth of the source electrode 0041).

When the shape of the cross-section of the source electrode 0041 and/or the drain electrode 0042 perpendicular to the surface of the substrate 010 is one of the above shapes, the source electrode 0041 and/or the drain electrode 0042 may be considered as a structure with grooves. In this way, a heat dissipation area of the source electrode 0041 and/or the drain electrode 0042 may be increased. In comparison to the situation that the orthographic projections of the source electrode 0041 and the drain electrode 0042 on the substrate 010 are both rectangular, due to the presence of the grooves, the Joule heat generated during the operation of the thin film transistor may be more uniformly dissipated, so that the heat may not gather in the source electrode 0041 or the drain electrode 0042, and the stability of the thin film transistor when in use may be improved to a certain extent. Particularly, for a display device with a high resolution, since the display device needs to be driven by a large current, there is much heat generated during its operation. Therefore, this effect is particularly obvious in such a display device. In addition, when the thin film transistor provided in the embodiments of the present disclosure is used in a flexible display device, the grooves are advantageous to release a stress generated when the display device is bent, and thus the extension of cracks inside the device resulted from bending may be reduced, thereby prolonging the service life of the display device.

In an embodiment of the present disclosure, the orthographic projection of the gate pattern 001, the gate insulating layer 002 and/or the active layer 003 on the substrate 010 may be elliptic or circular, or may be of a conventional rectangular structure. When the orthographic projections of the gate pattern 001, the gate insulating layer 002 and the active layer 003 on the substrate 010 are elliptic or circular, an occupation area of the thin film transistor 00 in a pixel may be relatively reduced, and an aperture ratio of the pixel may be thus increased.

Figure 3A:
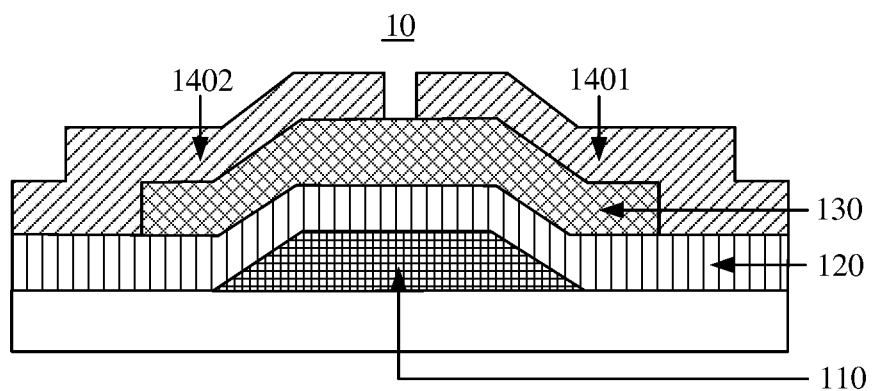
FIG. 3A is a sectional view of a traditional thin film transistor.
Figure 3B:
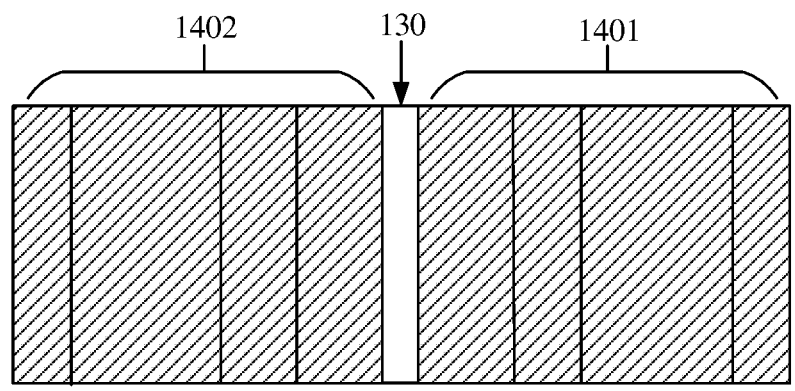
FIG. 3B is a top view of a source electrode and a gate electrode in the thin film transistor of FIG. 3A.

FIG. 3A is a sectional view of a traditional thin film transistor 10, and FIG. 3B is a top view of a source electrode and a gate electrode in the thin film transistor 10 of FIG. 3A. In FIGS. 3A and 3B, 110 denotes a gate pattern, 120 denotes a gate insulating layer, 130 denotes an active later, 1401 denotes a source electrode and 1402 denotes a drain electrode. In this structure, the source electrode 1401 and the drain electrode 1402 are arranged at two ends on a side of the gate pattern 110 away from a substrate, respectively. In addition, the orthographic projection of the source electrode 1401 on the substrate is partially overlapped with the orthographic projection of the gate pattern 110 on the substrate, and the orthographic projection of the drain electrode 1402 on the substrate is partially overlapped with the orthographic projection of the gate pattern 110 on the substrate. However, the orthographic projection of the source electrode 1401 on the substrate is not overlapped with the orthographic projection of the drain electrode 1402 on the substrate, and the orthographic projections of the source electrode 1401 and the drain electrode 1402 of the thin film transistor 10 on the substrate are both rectangular.

When a source-drain voltage $V_{DS}$ is greater than the turn-on voltage $V_{th}$ of the channel, there will be a conducting channel in the active layer 130 of the thin film transistor 10. When $V_{DS}=V_{GS}-V_{th}$, there will be a pinch-off region in the channel. In this case, the drain current is saturated and will not change with the change in the drain voltage, where $V_{GS}$ is the gate voltage. When $V_{DS} \geq V_{GS}-V_{th}$, there will be a pinch-off region within the channel, and the pinch-off region will grow with the increase in $V_{DS}$. In this case, the effective length of the channel is (L−ΔL), where L is a channel length when the channel is turned on and ΔL is a length of the pinched-off channel. In the thin film transistor 10 of this structure, a calculation formula of the drain current is as follows: $I_{D1}=W/L*\mu*C*[(V_{GS}-V_{th})-\frac{1}{2}*V_{DS}]$, where $I_{D1}$ is the drain current, $f_1=W/L$ is the width-to-length ratio of the channel formed when the thin film transistor 10 is turned on, μ is a field-effect mobility of a field-effect transistor, and C is a capacitance of the gate insulating layer.

In general, in a display device with a high resolution and a large size, the thin film transistor uses a short channel (for example, the length of the channel is less than 4 μm). In the display device using the short channel, since the length L of the channel is small, the length Δ L of the pinched-off channel cannot be ignored relative to the length L of the channel. In this case, the width-to-length ratio W/L of the channel is a variable value (the width-to-length ratio $f_1$ of the channel is W/(L−ΔL)), and the drain current will increase with the increase in $V_{DS}$. Therefore, the traditional thin film transistor may not provide a stable drive current for the display device, so that the display effect of the display device may be influenced.

In the thin film transistor shown in FIGS. 1 and 2A, the drain current $I_{D2}$, the width-to-length ratio f2 of the channel formed when the thin film transistor is turned on, the gate voltage $V_{GS}$, the turn-on voltage $V_{th}$ of the channel and the drain voltage $V_{DS}$ satisfy the following formula:

$$\begin{cases} dV_{DS} = \frac{I_{D2}}{2\pi\sigma} * \frac{1}{r} dr \\ \sigma = \mu * C * [(V_{GS} - V_{th}) - V_{DS}] \\ \int_0^{V_{DS}} [(V_{GS} - V_{th}) - V_{DS}] dV_{DS} = \frac{I_{D2}}{2\pi * \mu * C} * \int_0^{V_{DS}} \frac{1}{r} dr \end{cases}$$

where a value range of r is [R1, R2].

In accordance with the above formula, the calculation formula of the drain current is as follows: $I_{D2}$=f2*μ *C* $[(V_{GS}-V_{th})-\frac{1}{2}*V_{DS}]$, where f2=2π/[ln((R2−ΔL$_D$)/R1)], and ln is a logarithm operator.

It can be known from the comparison of this calculation formula of the drain current with the calculation formula of the drain current of the traditional thin film transistor that, when there is a pinch-off region in the channel, the difference in the two currents is mainly embodied by the width-to-length ratio of the channel. Moreover, since the width-to-length ratio of the channel in the traditional thin film transistor is f1=W/(L−ΔL), and in the embodiments of the present disclosure, the width-to-length ratio of the channel of the thin film transistor in the calculation formula of $I_{D2}$ is f2=2π/[ln((R2−ΔL$_D$)/R1)]. Therefore, it can be seen that the width-to-length ratio f1 of the channel in the traditional thin film transistor linearly changes with ΔL while the width-to-length ratio f2 of the channel in the calculation formula of $I_{D2}$ logarithmically changes with ΔL$_D$. It can be known from the related natures of the linear function and the logarithmic function that, when a pinch-off region occurs in the channel, the drain current in the traditional thin film transistor will have a high fluctuation, while the drain current in the embodiments of the present disclosure will have a small fluctuation. In addition, the amplitude of fluctuation of the drain current in the embodiments of the present disclosure is far less than the amplitude of fluctuation of the drain current in the traditional thin film transistor. Therefore, when the thin film transistor shown in FIGS. 1 and 2A provides a drive current for a display device, the stability of the drive current may be higher. Meanwhile, when the thin film transistor uses a short channel, this effect may be particularly obvious.

Correspondingly, since the circle is a special ellipse, the ellipse has roughly similar natures to the circle, and the elliptic ring also has similar natures to other ring shapes or the circle ring. Moreover, when a pattern formed by the orthographic projections of the source electrode and the drain electrode is a non-centrosymmetric pattern, a centrosymmetric pattern can be obtained after a certain translation or other transformations are performed on the non-centrosymmetric pattern. Therefore, a simple transformation can be performed on the calculation formula of the drain current of the thin film transistor in FIGS. 1 and 2A, to obtain a calculation formula of the drain current when the pattern formed by the orthographic projections of the drain electrode and the source electrode on the substrate is in other shapes mentioned in the embodiments of the present disclosure, and the width-to-length ratio f2 of the channel obtained after the transformation still logarithmically changes with ΔL$_D$. Therefore, when the thin film transistor provided in the embodiments of the present disclosure is used for providing a drive current for a display device, the display device may have a better display effect. The principle will not be repeated in the embodiments of the present disclosure.

It is to be noted that, when a pinch-off region occurs in the channel, the area of the pinch-off region is identical to another area of the pinch-off region at another time at a same source-drain voltage, and the pinch-off region gradually extends from the drain electrode to the source electrode. Therefore, if it is expected to obtain a stable drive current, it needs to be ensured that the drain electrode surrounds the source electrode. The principle will be described by taking the orthographic projection of the drain electrode on the substrate being shaped like a circular ring and the orthographic projection of the source electrode on the substrate being circular as example.

Figure 4A:
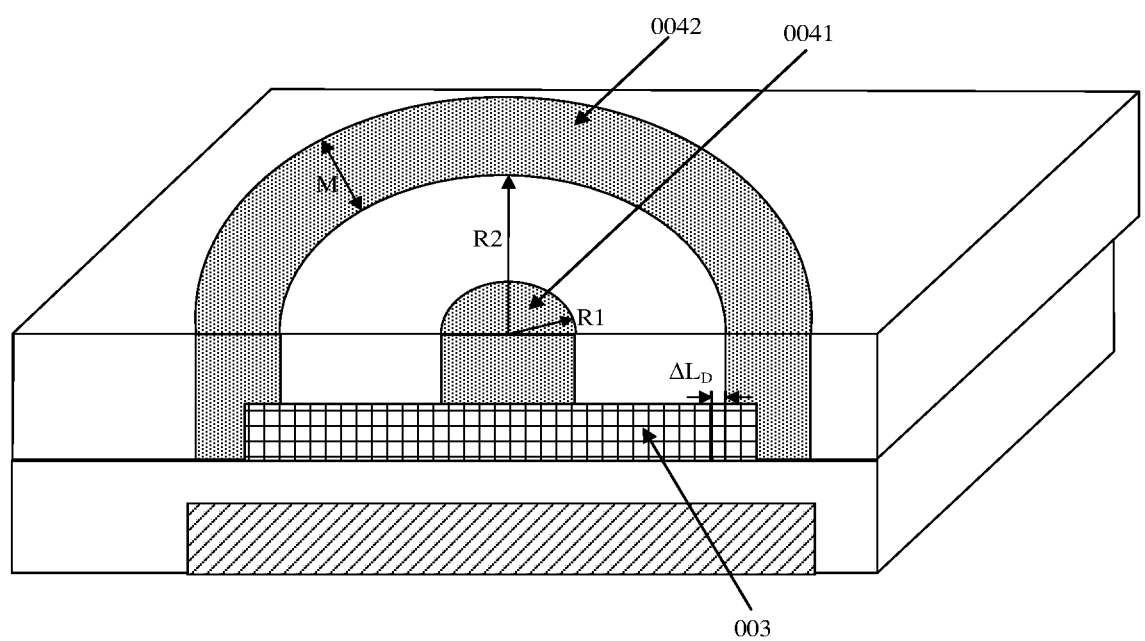
FIG. 4A is a schematic diagram of a thin film transistor according to an embodiment of the present disclosure, in which a channel has been pinched off in a situation that an orthographic projection of a drain electrode on the substrate is shaped like a circular ring, an orthographic projection of a source electrode on the substrate is circular, and the drain electrode surrounds the source electrode.
Figure 4B:
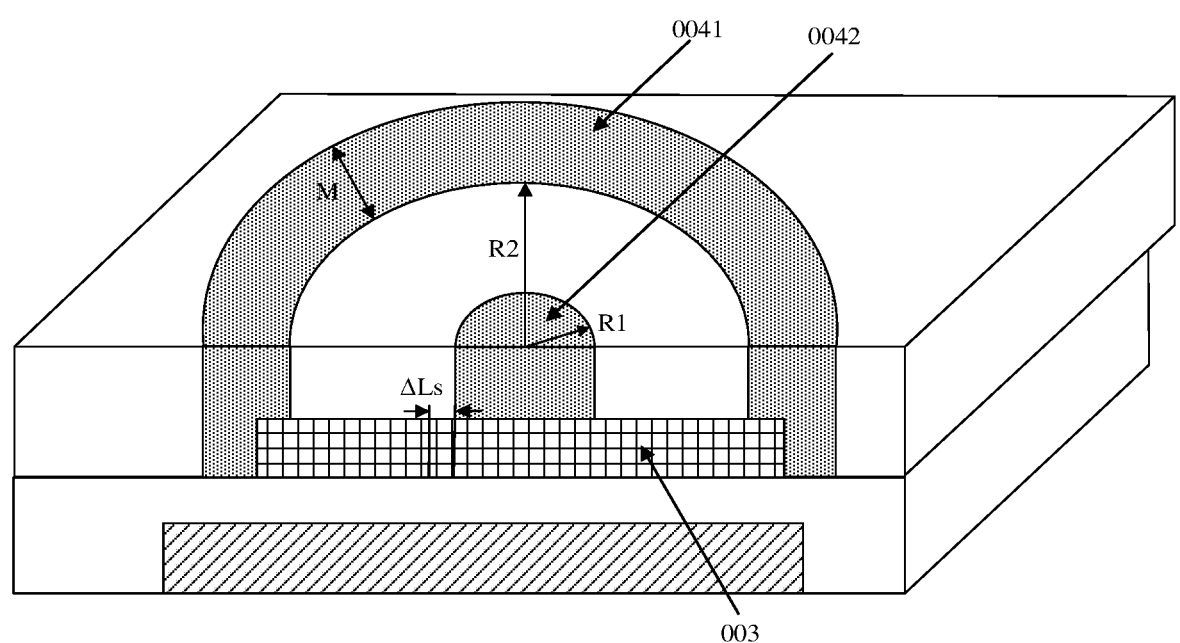
FIG. 4B is a schematic diagram of a thin film transistor according to an embodiment of the present disclosure, in which a channel has been pinched off in a situation that an orthographic projection of a source electrode on the substrate is shaped like a circular ring, an orthographic projection of a drain electrode on the substrate is circular, and the source electrode surrounds the drain electrode.

FIG. 4A shows a schematic diagram of a thin film transistor in which the channel has been pinched off in a situation that the orthographic projection of the drain electrode 0042 on the substrate is shaped like a circular ring, the orthographic projection of the source electrode 0041 on the substrate is circular and the drain electrode 0042 surrounds the source electrode 0041. In this situation, the width-to-length ratio of the channel is f2=2π/[ln((R2−ΔL$_D$)/R1)] and an area of the pinch-off region is S2=π*(R2+M)$^2$−π*(R2−ΔL$_D$)$^2$, where ΔL$_D$ is the length of the pinched-off channel in this structure, R1 is a radius of the circle of the orthographic projection of the source electrode 0041 on the substrate 010, R2 is a radius of the circular ring of the orthographic projection of the drain electrode 0042 on the substrate 010, and M is a line width of the drain electrode. FIG. 4B shows a schematic diagram after the channel is pinched off in a situation that the orthographic projection of the source electrode 0041 on the substrate 010 is shaped like a circular ring, the orthographic projection of the drain electrode 0042 on the substrate 010 is circular and the source electrode 0041 surrounds the drain electrode 0042. In this situation, the width-to-length ratio of the channel is f3=2π/[ln((R2/(R1−ΔL$_s$))] and the area of the pinch-off region is S3=π*(R1+ΔL$_s$)$^2$, where ΔL$_s$ is a length of the pinched-off channel in this structure, R1 is a radius of the circle of the orthographic projection of the drain electrode 0042 on the substrate, and R2 is a radius of the circular ring of the orthographic projection of the source electrode 0041 on the substrate. Exemplarily, if it is assumed that R1=1 μm, R2=3 μm and the line width M=1 μm, when the area of the pinch-off region is 7.59π μm$^2$, 7.29π μm$^2$ and 7.41π μm$^2$, respectively, the length of the pinched-off channel and the length-to-width ratio of the channel in the two structures refer to the data in Table 1.

TABLE 1

| Area of the pinch-off region | The drain electrode surrounds the source electrode | The source electrode surrounds the drain electrode |
|---|---|---|
| 7.5π μm$^2$ | f2 = 5.89<br>ΔL$_D$ = 0.1 μm | f3 = 72<br>ΔL$_s$ = 1.75 μm |
| 7.29π μm$^2$ | f2 = 5.80 | f3 = 62.8 |

TABLE 1-continued

| Area of the pinch-off region | The drain electrode surrounds the source electrode | The source electrode surrounds the drain electrode |
|---|---|---|
| 7.41π μm² | $\Delta L_D$ = 0.05 μm<br>f2 = 5.84<br>$\Delta L_D$ = 0.07 μm | $\Delta L_s$ = 1.7 μm<br>f3 = 64.1<br>$\Delta L_s$ = 1.72 μm |

It can be known from Table 1 that, when the length of the pinched-off channel changes, the influence on the length-to-width ratio of the channel in the structure in which the drain electrode 0042 surrounds the source electrode 0041 is little and may be ignored, while the influence on the length-to-width ratio of the channel in the structure where the source electrode 0041 surrounds the drain electrode 0042 is great and may not be ignored. Therefore, if it is expected to obtain a stable drive current, it may need to be ensured that the drain electrode 0042 surrounds the source electrode 0041.

In conclusion, in the thin film transistor 00 provided by the embodiments of the present disclosure, by designing the orthographic projection of the drain electrode 0042 on the substrate 010 as a ring shape and the orthographic projection of the source electrode 0041 on the substrate 010 to be elliptic or circular, and allowing the drain electrode 0042 to surround the source electrode 0041, the length-to-width ratio of the channel of the thin film transistor 00 becomes a log function of the size of the channel. The length-to-width ratio of the channel changes slowly when the effective length of the channel changes. Therefore, the amplitude of fluctuation of the drain current may be reduced, and the stability of the drain current may be improved, thereby reducing the influence of the change in drain current on the display effect of a display device.

An embodiment of the present disclosure provides a method for manufacturing the thin film transistor described above in the embodiments of the present disclosure. The method includes a step of forming a gate pattern, a gate insulating layer, an active layer and a source-drain pattern on a substrate. In this case, the source-drain pattern including a source electrode and a drain electrode, an orthographic projection of the drain electrode on the substrate is shaped like a ring, an orthographic projection of the source electrode on the substrate is elliptic or circular, and the drain electrode is arranged around the source electrode.

In conclusion, in the thin film transistor manufactured by the method provided by this embodiment of the present disclosure, by designing the orthographic projection of the drain electrode on the substrate as a ring shape and the orthographic projection of the source electrode on the substrate to be elliptic or circular, and allowing the drain electrode to surround the source electrode, the length-to-width ratio of the channel of the thin film transistor becomes a log function of the size of the channel. The length-to-width ratio of the channel changes slowly when the effective length of the channel changes. Therefore, the amplitude of fluctuation of the drain current may be reduced, and the stability of the drain current may be improved, thereby reducing the influence of the change in drain current on the display effect of a display device.

Figure 5:
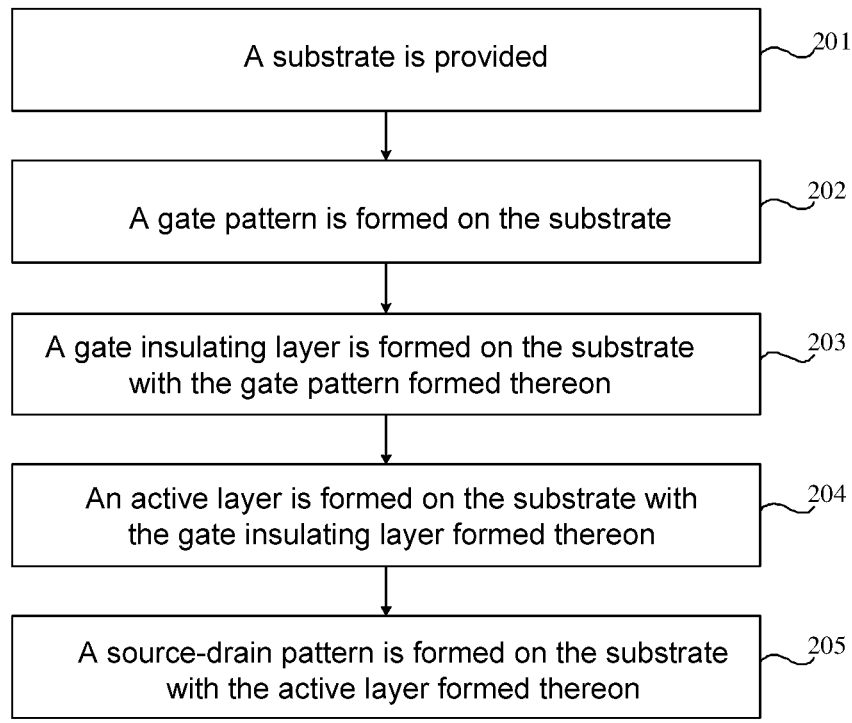
FIG. 5 shows a method for manufacturing a thin film transistor according to an embodiment of the present disclosure.

FIG. 5 is a flowchart of a method for manufacturing the thin film transistor according to an embodiment of the present disclosure. The thin film transistor may be of a top-gate structure or a bottom-gate structure. The method for manufacturing the thin film transistor provided in this embodiment of the present disclosure will be described by taking the thin film transistor being of a bottom-gate structure as example. Correspondingly, when the thin film transistor is of a top-gate structure, its manufacturing method may refer to the method for manufacturing the thin film transistor of the bottom-gate structure and will not be repeated in the embodiments of the present disclosure. As shown in FIG. 5, the method may include steps 201-205.

In step 201, a substrate is provided.

The substrate may be a transparent substrate. For example, the substrate may be a substrate made of light-guiding and nonmetallic material having a certain robustness, such as glass, quartz, transparent resin or the like.

In step 202, a gate pattern is formed on the substrate.

In an embodiment, the gate pattern may be formed from metal material. For example, the gate pattern is made of Mo, Cu, Al and alloys thereof. The value range of the thickness of the gate pattern may be set according to actual requirements. For example, the thickness may be set as 200 nm to 600 nm, such as 200 nm, 300 nm, 400 nm, 500 nm, or 600 nm. This will not be limited in the embodiments of the present disclosure.

Exemplarily, a layer of metal material of a certain thickness may be deposited on the substrate by magnetron sputtering, thermal evaporation, plasma enhanced chemical vapor deposition (PECVD) or other methods to obtain a metal material layer, and the metal material layer is then processed by a one-step patterning process to obtain the gate pattern. The one-step patterning process may include photoresist coating, exposure, developing, etching and photoresist stripping.

In step 203, a gate insulating layer is formed on the substrate with the gate pattern formed thereon.

In an embodiment, the gate insulating layer may be formed from silicon dioxide, silicon nitride or mixture of the both, and the thickness of the gate insulating layer may be set according to actual requirements. For example, the thickness may be set as 30 nm to 70 nm, such as 30 nm, 40 nm, 50 nm, 60 nm, or 70 nm. This will not be limited in the embodiments of the present disclosure.

Exemplarily, a layer of silicon dioxide of a certain thickness may be deposited on the substrate with the gate pattern formed thereon by coating, magnetron sputtering, thermal evaporation, PECVD or other methods to obtain a silicon dioxide material layer, and the silicon dioxide material layer is then roasted to obtain the gate insulating layer.

In an example, when the gate insulating layer includes a pattern, the silicon dioxide material layer may also be processed by a one-step patterning process to obtain the gate insulating layer, and this will not be repeated in the embodiments of the present disclosure.

In step 204, an active layer is formed on the substrate with the gate insulating layer formed thereon.

In an embodiment, the active layer may be an amorphous silicon film layer or a polycrystalline silicon film layer. For example, the active layer may be made of amorphous indium gallium zinc oxide (a-IGZO). This will not be limited in the embodiments of the present disclosure.

Exemplarily, an amorphous silicon film layer (i.e., an active layer) having a certain thickness may be deposited on the substrate with the gate insulating layer formed thereon by coating, magnetron sputtering, thermal evaporation, PECVD or other methods. In an example, the active layer may be processed by a one-step patterning process to obtain an active layer with a certain pattern.

In step 205, a source-drain pattern is formed on the substrate with the active layer formed thereon.

The source-drain pattern includes a source electrode and a drain electrode. The orthographic projection of the drain electrode on the substrate may be shaped like a ring, the orthographic projection of the source electrode on the substrate may be elliptic or circular, and the drain electrode surrounds the source electrode. In an example, the orthographic projection of the drain electrode on the substrate is shaped like a circular ring, the orthographic projection of the source electrode on the substrate is circular, and the drain electrode surrounds the source electrode. Moreover, in an example, the source electrode and the drain electrode may be concentric.

Exemplarily, a source-drain film layer may be deposited on the substrate with the active layer formed thereon by magnetron sputtering, thermal evaporation, PECVD or other methods. The source-drain film layer may be made of Mo, Cu, Al and alloys thereof, and this will not be limited in the embodiments of the present disclosure. Then, the source-drain film layer is processed by a one-step patterning process to form the source-drain pattern. For example, the cross-section of the source electrode perpendicular to the surface of the substrate may be formed to be saw-toothed or waved by a patterning process, and/or the cross-section of the drain electrode perpendicular to the surface of the substrate may be formed to be saw-toothed or waved by a patterning process. In an example, when the cross-section of the source electrode perpendicular to the surface of the substrate is saw-toothed and/or the cross-section of the drain electrode perpendicular to the surface of the substrate is saw-toothed, the depths of teeth of the saw-toothed shape may be allowed to be less than or equal to the thickness of a corresponding one of the source electrode and the drain electrode in a preset direction by a patterning process. The preset direction is perpendicular to the surface of the substrate.

In an embodiment, the orthographic projection of the gate pattern, the gate insulating layer and/or the active layer on the substrate is elliptic or circular. Meanwhile, when the orthographic projection of the gate pattern, the gate insulating layer and/or the active layer on the substrate is elliptic or circular, the occupation area of the thin film transistor in a pixel may be relatively reduced and the aperture ratio of the pixel may be increased.

It is to be noted that, the sequential order of the steps of the method for manufacturing the thin film transistor provided in this embodiment of the present disclosure may be adjusted properly, and the steps may be correspondingly omitted or added as desired. All methods easily conceived by a person of ordinary skill in the art within the technical scope of the present disclosure shall fall into the protection scope of the present disclosure and will not be repeated here.

In conclusion, in the method for manufacturing the thin film transistor provided by the embodiments of the present disclosure, by designing the orthographic projection of the drain electrode on the substrate as a ring shape and the orthographic projection of the source electrode on the substrate to be elliptic or circular, and allowing the drain electrode to surround the source electrode, the length-to-width ratio of the channel of the thin film transistor becomes a log function of the size of the channel. The length-to-width ratio of the channel changes slowly when the effective length of the channel changes. Therefore, the amplitude of fluctuation of the drain current may be reduced, and the stability of the drain current may be improved, thereby reducing the influence of the change in drain current on the display effect of a display device.

Figure 6:
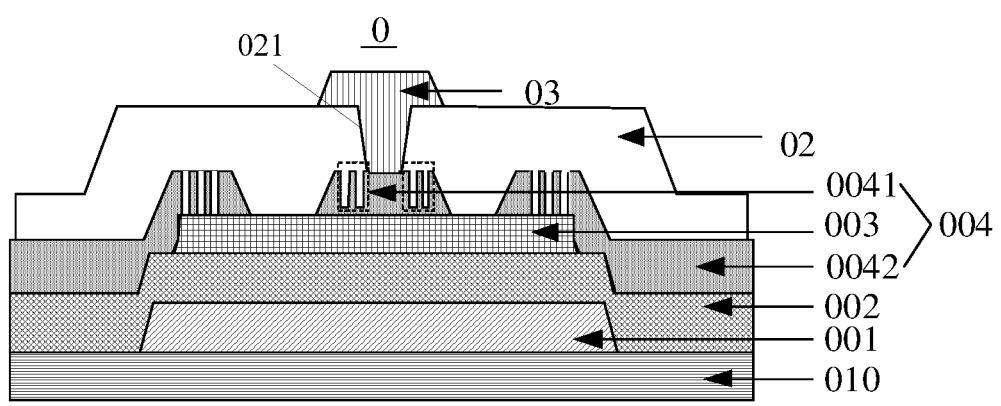
FIG. 6 is a sectional view of a display substrate according to an embodiment of the present disclosure.

As shown in FIG. 6, an embodiment of the present disclosure further provides a display substrate 0. The display substrate 0 includes the thin film transistor 00 shown in any one of FIG. 1, FIG. 2A and FIGS. 2K to 2N, or the thin film transistor manufactured by the method for manufacturing the thin film transistor shown in FIG. 5.

In an embodiment, as shown in FIGS. 2A and 6, the display substrate 0 may further include a drain lead 0043 which is connected to the drain electrode 0042. In addition, the display substrate 0 may further include a passivation layer 02 provided on the source-drain pattern 004, a via 021 formed on the passivation layer 02 and a source lead 03 provided on the passivation layer 02. In this structure, the source lead 03 is connected to the source electrode 0041 through the via 021. Both the drain lead 0043 and the source lead 0041 are connected to a data line.

In conclusion, in the display substrate 0 provided by the embodiments of the present disclosure, by designing the orthographic projection of the drain electrode 0042 on the substrate 010 as a ring shape and the orthographic projection of the source electrode 0041 on the substrate 010 to be elliptic or circular, and allowing the drain electrode 0042 to surround the source electrode 0041, the length-to-width ratio of the channel of the thin film transistor 00 becomes a log function of the size of the channel. The length-to-width ratio of the channel changes slowly when the effective length of the channel changes. Therefore, the amplitude of fluctuation of the drain current may be reduced, and the stability of the drain current may be improved, thereby reducing the influence of the change in drain current on the display effect of a display device.

Figure 7:
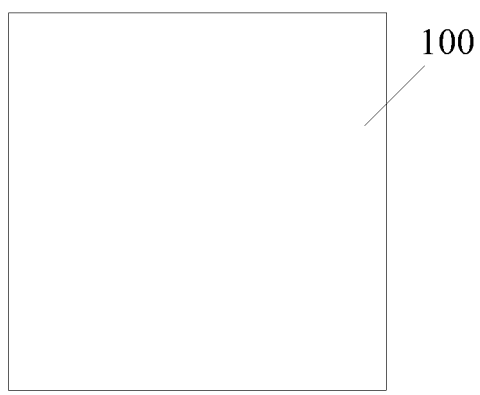
FIG. 7 is a schematic diagram of a display device according to an embodiment of the present disclosure.

As shown in FIG. 7, an embodiment of the present disclosure further provides a display panel 100. The display panel 100 includes the display substrate 0 provided by the above embodiments of the present disclosure.

The display panel 100 may be a liquid crystal panel, electronic paper, a mobile phone, a flat computer, a TV set, a display, a notebook computer, a digital picture frame, a navigator or any display panel of a product or component having a display function.

In an embodiment, the display panel 100 may be a current-driven display panel. For example, the display panel 100 may be an active matrix organic light emitting diode (AMOLED) display panel driven by a constant current.

In conclusion, in the display panel 100 provided by the embodiments of the present disclosure, by designing the orthographic projection of the drain electrode on the substrate as a ring shape and the orthographic projection of the source electrode on the substrate to be elliptic or circular, and allowing the drain electrode to surround the source electrode, the length-to-width ratio of the channel of the thin film transistor becomes a log function of the size of the channel. The length-to-width ratio of the channel changes slowly when the effective length of the channel changes. Therefore, the amplitude of fluctuation of the drain current may be reduced, and the stability of the drain current may be improved, thereby reducing the influence of the change in drain current on the display effect of a display device.

It may be understood by a person of ordinary skill in the art that all or part of the steps for implementing the embodiments can be implemented by hardware, or by instructing related hardware through programs. The programs may be stored in a computer-readable storage medium, and the storage medium may be a read-only memory, a magnetic disk, an optical disk or the like.

The forgoing description merely shows some of the embodiments of the present disclosure and is not intended to limit the present disclosure. Any modification, equivalent replacement and improvement made within the spirit and principle of the present disclosure shall fall into the protection scope of the present disclosure.

What is claimed is:

1. A thin film transistor, comprising a gate pattern, a gate insulating layer, an active layer and a source-drain pattern, which are all arranged on a substrate, wherein,
the source-drain pattern comprises a source electrode and a drain electrode, an orthographic projection of the drain electrode on the substrate being shaped like a ring, an orthographic projection of the source electrode on the substrate being elliptic or circular, and the drain electrode being arranged around the source electrode, wherein,
a cross-section of the source electrode perpendicular to a surface of the substrate is saw-toothed, depths of teeth of a saw-toothed shape are equal to a thickness of the source electrode in a preset direction, and
a cross-section of the drain electrode perpendicular to a surface of the substrate is saw-toothed, depths of teeth of a saw-toothed shape are equal to a thickness of the drain electrode in a preset direction, the preset direction is perpendicular to the surface of the substrate.

2. The thin film transistor according to claim 1, wherein, the orthographic projection of the drain electrode on the substrate is shaped like a circular ring, and the orthographic projection of the source electrode on the substrate is circular.

3. The thin film transistor according to claim 2, wherein, the source electrode and the drain electrode are concentric.

4. The thin film transistor according to claim 1, wherein, a cross-section of the source electrode perpendicular to the surface of the substrate is saw-toothed or waved.

5. The thin film transistor according to claim 1, wherein, a cross-section of the drain electrode perpendicular to the surface of the substrate is saw-toothed or waved.

6. The thin film transistor according to claim 1, wherein, orthographic projections of the gate pattern, the gate insulating layer and the active layer on the substrate are elliptic or circular.

7. The thin film transistor according to claim 1, wherein, an orthographic projection of the gate pattern, the gate insulating layer or the active layer on the substrate is elliptic or circular.

8. A method for manufacturing the thin film transistor according to claim 1, comprising forming the gate pattern, the gate insulating layer, the active layer and the source-drain pattern on the substrate, wherein,
the source-drain pattern comprises the source electrode and the drain electrode, the orthographic projection of the drain electrode on the substrate being shaped like a ring, the orthographic projection of the source electrode on the substrate being elliptic or circular, and the drain electrode being arranged around the source electrode, wherein,
a cross-section of the source electrode perpendicular to a surface of the substrate is saw-toothed, depths of teeth of a saw-toothed shape are equal to a thickness of the source electrode in a preset direction, and
a cross-section of the drain electrode perpendicular to a surface of the substrate is saw-toothed, depths of teeth of a saw-toothed shape are equal to a thickness of the drain electrode in a preset direction, the preset direction is perpendicular to the surface of the substrate.

9. A display substrate, comprising the thin film transistor according to claim 1.

10. The display substrate according to claim 9, further comprising:
a drain lead connected to the drain electrode;
a passivation layer provided on the source-drain pattern;
a via formed on the passivation layer; and
a source lead provided on the passivation layer, the source lead being connected to the source electrode through the via.

11. A display panel, comprising the display substrate according to claim 9.

12. The display panel according to claim 11, wherein, the display panel is a current-driven display panel.

13. The thin film transistor according to claim 1, wherein, the saw-toothed shape is square waves saw teeth.

14. The thin film transistor according to claim 1, wherein, the saw-toothed shape is triangular saw teeth.

* * * * *